(12) United States Patent
Nakayama et al.

(10) Patent No.: US 8,734,166 B2
(45) Date of Patent: May 27, 2014

(54) PRINTED WIRING BOARD AND CONNECTOR, AND METHOD FOR MANUFACTURING PRINTED WIRING BOARD

(71) Applicant: Fujitsu Limited, Kawasaki (JP)

(72) Inventors: Tsutomu Nakayama, Kawasaki (JP); Kengo Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/863,818

(22) Filed: Apr. 16, 2013

(65) Prior Publication Data
US 2013/0230992 A1    Sep. 5, 2013

Related U.S. Application Data

(63) Continuation of application No. PCT/JP2010/068636, filed on Oct. 21, 2010.

(51) Int. Cl.
*H01R 12/00* (2006.01)

(52) U.S. Cl.
USPC ............................. 439/65; 361/748; 174/262

(58) Field of Classification Search
USPC ..................... 439/65; 361/748; 174/262, 266
See application file for complete search history.

(56) References Cited

U.S. PATENT DOCUMENTS

| | | | |
|---|---|---|---|
| 6,267,604 B1 | 7/2001 | Mickievicz et al. | |
| 6,392,897 B1 | 5/2002 | Nakase et al. | |
| 6,541,712 B1* | 4/2003 | Gately et al. | 174/266 |
| 2006/0121722 A1* | 6/2006 | Card et al. | 438/622 |
| 2007/0258223 A1* | 11/2007 | Khilchenko et al. | 361/748 |
| 2010/0151704 A1* | 6/2010 | Yasumura et al. | 439/65 |
| 2010/0233906 A1 | 9/2010 | Miki et al. | |

FOREIGN PATENT DOCUMENTS

| | | |
|---|---|---|
| JP | 11-251539 | 9/1999 |
| JP | 2003-283093 | 10/2003 |
| JP | 2003-536205 | 12/2003 |
| JP | 2009-129078 | 6/2009 |
| JP | 2010-212147 | 9/2010 |

OTHER PUBLICATIONS

International Search report mailed Jan. 11, 2011 in corresponding International Application No. PCT/JP2010/068636.

* cited by examiner

*Primary Examiner* — Truc Nguyen
(74) *Attorney, Agent, or Firm* — Staas & Halsey LLP

(57) ABSTRACT

A printed wiring board includes a board body that includes a signal line embedded at a predetermined wiring position and a through hole electrically connected to the signal line, and a connector that includes a connector plate including a connection terminal electrically connected to the signal line via the through hole, and electrically connects the connection terminal to the signal line by insertion of the connection terminal of the connector plate into the through hole in a direction of one of a front surface and a rear surface of the board body according to a wiring position of the signal line so that a transmission path of the connection terminal on a stub side is shorter than a transmission path of the connection terminal on an input and output side.

5 Claims, 9 Drawing Sheets

PRINTED WIRING BOARD AND CONNECTOR, AND METHOD FOR MANUFACTURING PRINTED WIRING BOARD

CROSS-REFERENCE TO RELATED APPLICATION

This application is a continuation of International Application No. PCT/JP2010/068636, filed on Oct. 21, 2010 and designating the U.S., the entire contents of which are incorporated herein by reference.

FIELD

The embodiments discussed herein are related to a printed wiring board, a connector, and a method of manufacturing the printed wiring board.

BACKGROUND

In recent years, printed wiring boards configured highly densely by a multi-layer structure have been used. A connector for high-speed transmission is mounted on an end of a printed wiring board. Thus, by mounting the connector for high-speed transmission on the printed wiring board, high-speed transmission is enabled between the printed wiring board and another board via the connector.

Hereinafter, an overview of the configuration of a connector will be described with reference to FIGS. 11 to 13. FIG. 11 is a perspective view illustrating the outer appearance of a printed wiring board. FIG. 12 is a plan view illustrating a connector in FIG. 11. FIG. 13 is a sectional view taken along the line A-A of FIG. 12.

As illustrated in FIGS. 11 to 13, a connector 10 is mounted on the end of a printed wiring board 1 and is configured by joining and combining a plurality of connector plates 11 (six connector plates in FIGS. 11 and 12) with a blade shape. When the plurality of connector plates 11 is joined to each other, the joined connector plates 11 are integrally fixed by fixing plates 25.

The connector plate 11 is formed of a resin plate that has an entire thin plate shape and a substantial L shape and includes an upper-side plate 12 and a lateral-side plate 13. A connector pin 20 that is electrically connected to a signal line 4 embedded in a board body 2 of the printed wiring board 1 is installed inside the connector plate 11.

The connector pin 20 includes a plurality of a pin members 21 (three pin members in FIG. 13). The pin member 21 includes connection pins 22 that extend in a predetermined direction (the lower side in FIGS. 11 and 13) and pin terminals 23 that are disposed in concave portions 14 of the lateral-side plate 13. The connection pins 22 of the connector pin 20 serve as input/output terminals of an electric signal transmitted from the signal line 4 of the printed wiring board 1. The pin terminals 23 of the connector pin 20 serve input/output terminals that input and output an electric signal transmitted from the connection pins 22 to connector pins of another connector (not illustrated).

As illustrated in FIG. 13, the connector 10 is press-fitted and fixed to a predetermined position (an end in FIG. 13) of the printed wiring board 1. That is, an electric signal transmitted from the signal line 4 of the printed wiring board 1 is transmitted to another connector via the connection pins 22 and the pin terminals 23 of the connector pin 20 of the connector 10. An electric signal from another connector is transmitted to the signal line 4 of the printed wiring board 1 via the connection pins 22 and the pin terminals 23 of the connector pin 20 of the connector 10.

Patent Document 1: Japanese Laid-open Patent Publication No. 2003-283093
Patent Document 2: Japanese Laid-open Patent Publication No. 11-251539

However, the connector plates 11 included in the connector 10 use a method of press-fitting and fixing the connector pins 20 from one side (the front surface L side in FIGS. 11, 12, and 13) to the printed wiring board 1. Therefore, there is a problem that an electric signal transmitted from the signal line 4 of the printed wiring board 1 or an electric signal transmitted through another connector may be attenuated due to the influence of a stub to be described below, and thus transmission quality or transmission efficiency of the electric signal may deteriorate.

That is, as illustrated in FIG. 13, the signal line 4 provided in the printed wiring board 1 is embedded in the board body 2 in the horizontal direction (traverse direction in FIG. 13). Further, through holes 3 formed in the printed wiring board 1 are through holes that penetrate the board body 2 in the vertical direction (the longitudinal direction in FIG. 13).

Therefore, when the connector 10 is press-fitted and fixed to the printed wiring board 1, the through holes 3 of the printed wiring board 1 are connected to the connection pins 22 of the connector pins 20 of the connector plates 11, and thus signal transmission paths between the signal line 4 and the connector 10 are formed. In this case, however, the transmission paths of an electric signal transmitted from the signal line 4 or an electric signal transmitted from another connector are branched in two directions.

Specifically, one transmission path (transmission path branched to the lower side in FIG. 13) of the transmission paths branched in two directions becomes a stub. As illustrated in FIG. 13, when the signal line 4 of the printed wiring board 1 is embedded at a position close to the front surface L side of the board body 2, the length of the stub is longer than the length of the transmission path directly transmitted from the signal line 4 via the connection pin 22.

That is, due the influence of the stub, the electric signal transmitted from the signal line 4 by the stub or the electric signal transmitted from another connector is reflected at the front end of the stub via the transmission path by the stub. Then, an attenuation phenomenon in which the electric signal is attenuated occurs due to the resonance of the signal reflected in this way. Thus, the deterioration in the transmission quality or transmission efficiency of the electric signal of the signal line 4 may cause deterioration in high-speed of signal transmission.

Further, when the transmission path of the stub side is long and the transmission speed is high, the electric signal is easily attenuated. That is, there is a problem that the attenuation phenomenon of the electric signal caused due to the stub may easily occur in a high-speed transmission path.

In recent years, as an LSI (Large Scale Integration) has a high function, the number of signal lines 4 embedded in the printed wiring board 1 increases and the plate thickness of the board is thickened, and thus the length of the stub side is lengthened. For this reason, a connector suppressing an adverse influence caused due to the stub is preferably realized.

Accordingly, to resolve the adverse influence caused due to the stub, a back drill process of scraping off a part of the stub is performed through counter-boring by a back drill. However, when the back drill process is performed, there are problems that a working process may become complicated, a yield ratio may be reduced due to an extra work, and a manufacturing cost of the printed wiring board may increase.

SUMMARY

According to an aspect of an embodiment, a printed wiring board includes a board body that includes a signal line embedded at a predetermined wiring position and a through hole electrically connected to the signal line, and a connector that includes a connector plate including a connection terminal electrically connected to the signal line via the through hole, and electrically connects the connection terminal to the signal line by insertion of the connection terminal of the connector plate into the through hole in a direction of one of a front surface and a rear surface of the board body according to a wiring position of the signal line so that a transmission path of the connection terminal on a stub side is shorter than a transmission path of the connection terminal on an input and output side.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings.

The present technology is not limited to this embodiment.

[a] First Embodiment

Figure 1:
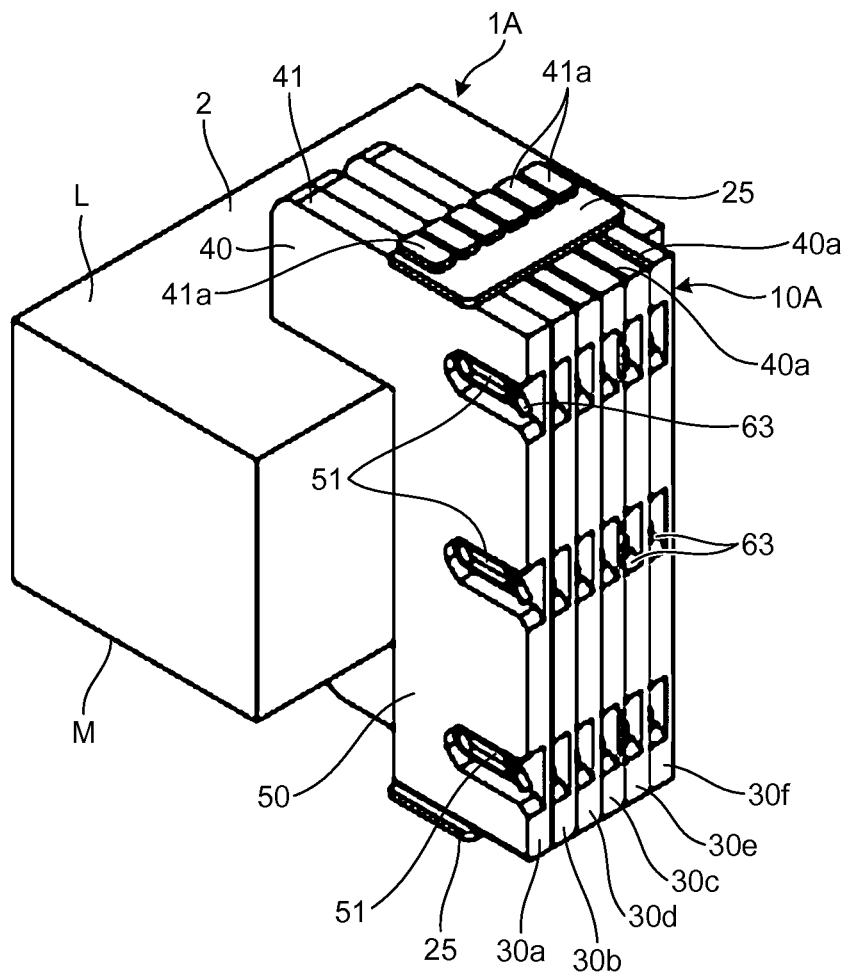
FIG. 1 is a perspective view illustrating the outer appearance of a printed wiring board according to a first embodiment.
Figure 2:
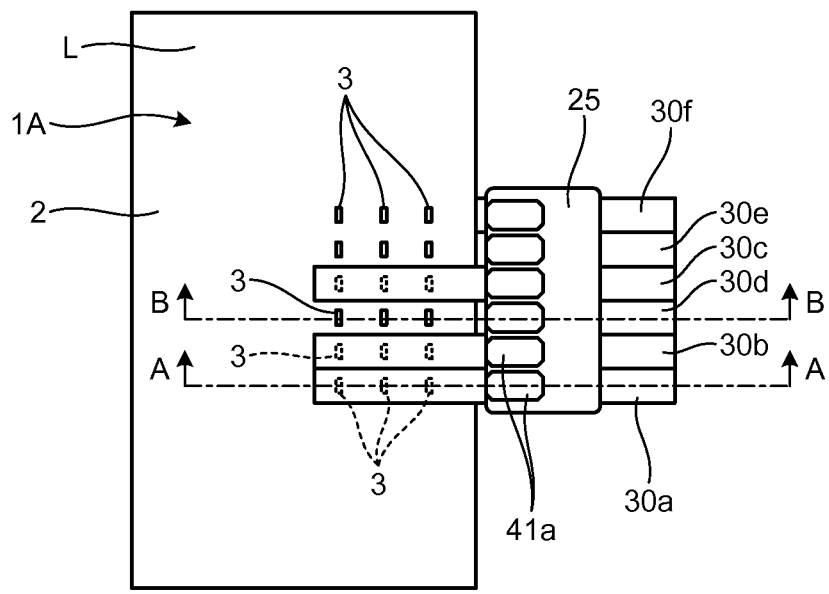
FIG. 2 is a plan view illustrating the printed wiring board.
Figure 3:
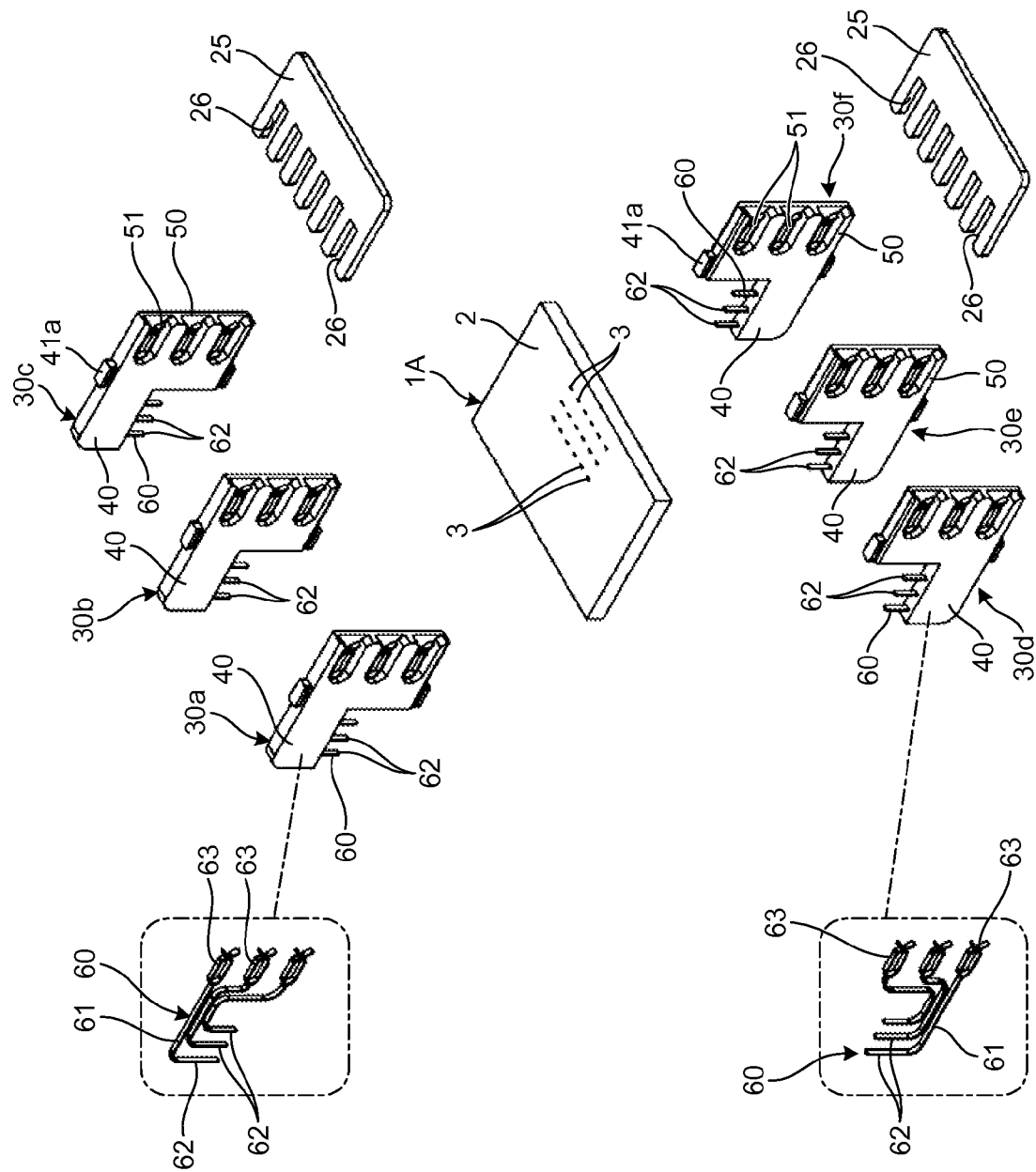
FIG. 3 is an exploded perspective view illustrating the printed wiring board.
Figure 4:
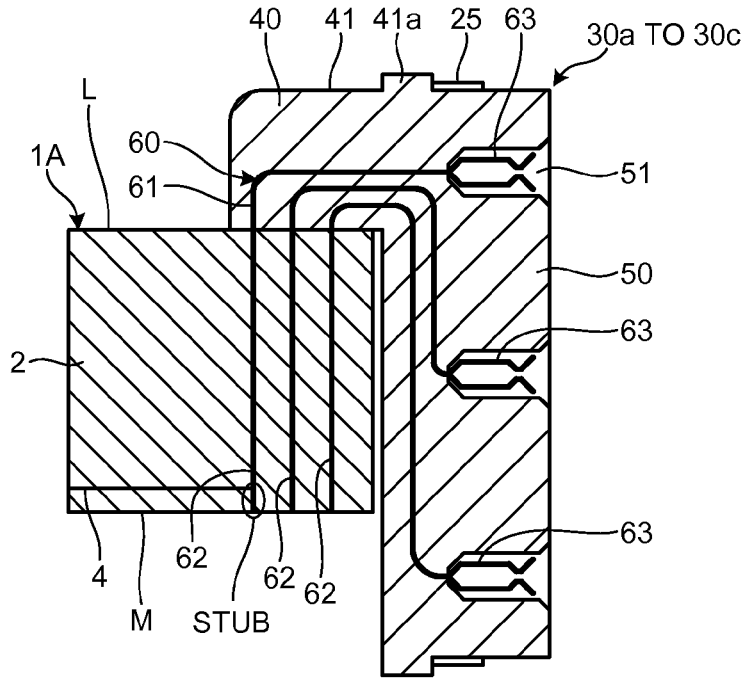
FIG. 4 is a sectional view illustrating a connector taken along the line A-A of FIG. 2.
Figure 5:
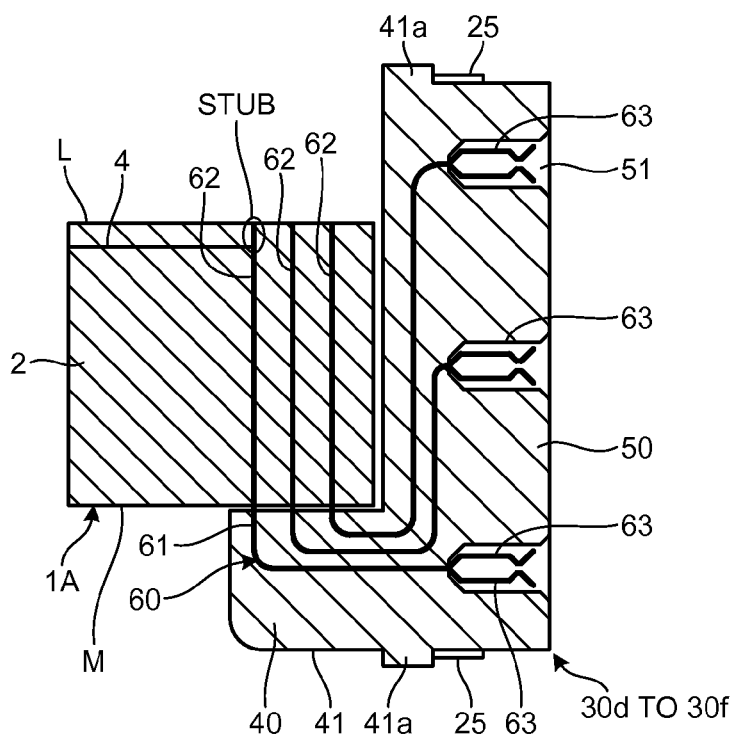
FIG. 5 is a sectional view illustrating the connector taken along the line B-B of FIG. 2.

FIG. 1 is a perspective view illustrating the outer appearance of a printed wiring board according to a first embodiment. FIG. 2 is a plan view illustrating the printed wiring board. FIG. 3 is an exploded perspective view illustrating the printed wiring board. FIG. 4 is a sectional view illustrating a connector taken along the line A-A of FIG. 2. FIG. 5 is a sectional view illustrating the connector taken along the line B-B of FIG. 2. In the first embodiment to be described below, the same reference numerals are given to the same constituent elements of the connector described above, and the description thereof will not be repeated.

As illustrated in FIGS. 1 to 3, a printed wiring board 1A is a multi-layer printed wiring board configured highly densely by a multi-layer structure and includes electronic components (not illustrated) mounted on a surface and a board body 2 in which signal lines 4 connected to an electronic circuit are embedded at a predetermined position. Inside the printed wiring board 1A, the plurality of signal lines 4 is embedded in the horizontal direction (traverse direction in FIG. 1) of the board body 2.

By connecting and fixing a connector 10A to a predetermined position of a surface of the printed wiring board 1A, a plurality of through holes 3 (eighteen through holes in FIG. 2) to which connection pins 62 of the connector 10A are connected are formed. The through holes 3 are through holes that penetrate the inside of the board body 2 in the vertical direction (the longitudinal direction in FIGS. 4 and 5). That is, the through holes 3 penetrate in the front and back directions of the board body 2. An electric signal transmitted from the signal line 4 to the printed wiring board 1A is transmitted via the connection pin 62 of the connector 10A connected to the through hole 3. Further, an electric signal transmitted via another connector is transmitted to the signal line 4 via the connection pin 62 of the connector 10A.

That is, the connector 10A is formed by joining and combining a plurality of connector plates 30a to 30f (six connector plates in FIG. 1) in the horizontal direction. The connector plates 30a to 30f are formed of resin plates that each have an entire thin plate shape and a substantial L shape and each include an upper-side plate 40 and a lateral-side plate 50 curved at an almost right angle with respect to the upper-side plate 40. End edge portions 40a of the upper-side plates 40 are formed in an R shape (tapered shape) so that the upper-side plates 40 of the connector plates 30a to 30f do not come into contact with each other, when the connector plates 30a to 30f are joined.

A plurality of concave portions 51 (three concave portions in the drawing) are formed in an end (the right side in FIG. 1) of the lateral-side plate 50 of each of the connector plates 30a to 30f. Pin terminals 63 of connector pins 60 are provided in the concave portions 51. That is, pin terminals of a male-side connector (not illustrated) are inserted and connected to the pin terminals 63 of the connector pins 60 provided in the concave portions 51 of the lateral-side plate 50.

A plurality of convex portions 41a (six convex portions in FIGS. 1 and 2) formed as substantially rectangular protrusions are formed in the substantial middles of the upper surfaces 41 of the upper-side plates 40. The convex portions 41a formed on the upper-side plates 40 function as fixing portions that fix the fixing plate 25. That is, the connector plates 30a to 30f can be fixed by the fixing plate 25 formed in a pectinated shape, when the plurality of connector plates 30a to 30f are joined in the horizontal direction.

The fixing plate 25 is formed of a resin plate with an entire flat plate shape, and a plurality of concave portions 26 (see FIG. 3) engaging with the convex portions 41a formed in the upper-side plates 40 are formed. In the first embodiment, a pair of fixing plates 25 is provided in the upper and lower sides of the connector plates 30a to 30c and the connector plates 30d to 30f. Alternatively, the fixing plate 25 may be configured to be provided in either of the connector plates 30a to 30c and the connector plates 30d to 30f. A plate member having a dimension corresponding to the number of the plurality of superimposed connector plates 30d to 30f forming the connector 10A is used as the size (traverse width dimension) of the fixing plate 25.

The connector pins 60 (see FIG. 3) electrically connected to the signal line 4 of the printed wiring board 1A are embedded inside the connector plates 30a to 30f. The connector pin 60 includes a plurality of pin members 61 (three pin members in FIG. 3). The pin member 61 includes the connection pin 62 and the pin terminal 63.

That is, the pin member 61 of the connector pin 60 includes the connection pin 62 that extends in a predetermined direction (the lower side in FIG. 3) from the end of the upper-side plate 40 and the pin terminal 63 that is disposed in the concave portion 51 of the lateral-side plate 50. The connection pin 62 of the pin member 61 serves as an input terminal of an electric signal transmitted from the signal line 4 of the printed wiring board 1A. Further, the connection pin 62 of the pin member 61 serves as an output terminal of an electric signal transmitted via another connector.

The connection pins 62 are connected to the through holes 3 of the printed wiring board 1A, when the connector 10A is press-fitted and fixed to the printed wiring board 1A. At this time, the signal line 4 is electrically connected to the connector 10A. The pin terminal 63 of the pin member 61 serves as an output terminal that outputs an electric signal transmitted from the connection pin 62 to another connector. Further, the pin terminal 63 of the pin member 61 serves as an input terminal to which an electric signal transmitted via another connector is input.

Here, the connector 10A is press-fitted and fixed from one of the front surface L side or the rear surface M side so that the transmission path of the connection pins 62 on the stub side is shorter than the transmission path of the connection pins 62 on the input/output side according to the positions of the signal lines 4 embedded in the board body 2 of the printed wiring board 1A. That is, the connector plates 30a to 30f of the connector 10A can be assembled so that the connector plates 30a to 30f are selectively inserted into the through holes 3 from one of the front surface L side and the rear surface M side of the board body 2 forming the printed wiring board 1A.

That is, in regard to the connector 10A according to the first embodiment, as illustrated in FIG. 4, the three connector plates 30a to 30c among the plurality of connector plates 30a to 30f (six connector plates) forming the connector 10A are press-fitted and fixed from the front surface L side of the board body 2 of the printed wiring board 1A. Specifically, in regard to the connector plates 30a to 30c, the connection pins 62 of the connector pins 60 are connected to the through holes 3 formed in the board body 2 from the front surface L side of the printed wiring board 1A. As illustrated in FIG. 4, this is because the positions of the signal lines 4 to which the connection pins 62 of the connector pins 60 of the connector plates 30a to 30c are connected are positions close to the rear surface M side of the printed wiring board 1A.

Specifically, when the connector plates 30a to 30c are press-fitted and fixed from the front surface L side of the printed wiring board 1A according to the positions of the signal lines 4, the length of the transmission path on the stub side can be configured to be shorter than the length of the transmission path through which an electric signal is transmitted from the signal lines 4. In this case, as illustrated in FIG. 4, since the stub length is shortened, the high-speed transmission can be realized while ensuring the transmission quality of an electric signal transmitted from the signal line.

As illustrated in FIG. 5, the three connector plates 30d to 30f among the plurality of connector plates 30a to 30f (six connector plates in FIGS. 1 and 2) forming the connector 10A are press-fitted and fixed from the rear surface M side of the board body 2 of the printed wiring board 1A. Specifically, in regard to the connector plates 30d to 30f, the connection pins 62 of the connector pins 60 are connected to the through holes 3 formed in the board body 2 from the rear surface M side of the printed wiring board 1A. As illustrated in FIG. 5, this is because the positions of the signal lines 4 to which the connection pins 62 of the connector pins 60 of the connector plates 30d to 30f are connected are positions close to the front surface L side of the printed wiring board 1A.

That is, when the connector plates 30d to 30f are press-fitted and fixed from the rear surface M side of the printed wiring board 1A according to the positions of the signal lines 4, the length of the transmission path on the stub side can be configured to be shorter than the length of the transmission path through which an electric signal is transmitted from the signal lines 4. In this case, as in FIG. 4, since the stub length is shortened, the high-speed transmission can be realized while ensuring the transmission quality of an electric signal transmitted from the signal line 4. As illustrated in the drawing, due to a difference between the maximum board thickness corresponding to the connector 10A and the board thickness, a predetermined gap is formed between the rear surface M side of the printed wiring board 1A and the upper-side plate 40 of the connector 10A.

Method of Manufacturing Printed Wiring Board 1A

Next, a process of manufacturing the printed wiring board described in the first embodiment will be described in detail with reference to FIGS. 6A to 6D. FIGS. 6A to 6D are diagrams illustrating the order of the process of manufacturing the printed wiring board according to the first embodiment. The process of manufacturing the printed wiring board to be described here is performed by a predetermined board manufacturing system or a manual work. Here, the process will be described as an example in which the process is assumed to be performed by a board manufacturing system.

Figure 6A:
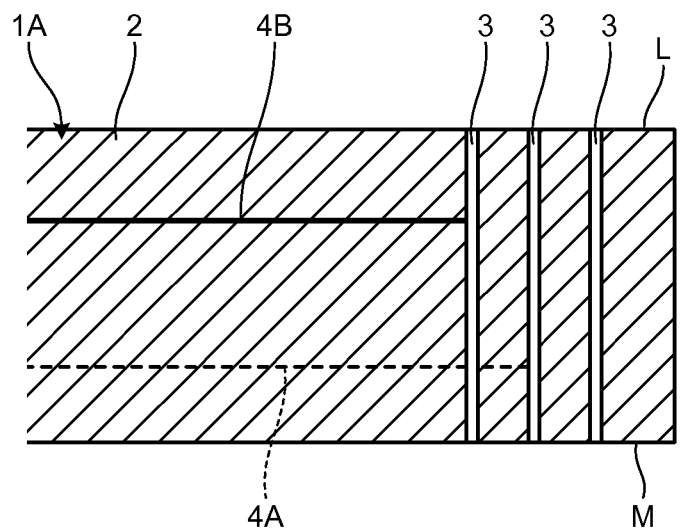
FIG. 6A is a diagram illustrating a process of manufacturing the printed wiring board.

First, as illustrated in FIG. 6A, in signal line position determining according to the first embodiment, the positions of the signal lines 4 embedded inside the printed wiring board 1A are determined. Specifically, it is determined whether the positions of the signal lines 4 embedded in the board body 2 of the printed wiring board 1A are positions closer to the front surface L side or the rear surface M side of the printed wiring board 1A.

Here, the description will be made below on the assumption that the embedded position of a signal lines 4A which is indicated by a dashed line and to which the connection pins 62 of the connector plates 30a to 30c are connected is determined to be the position closer the rear surface M side of the printed wiring board 1A. Further, the description will be made below on the assumption that the embedded position of a signal line 4B which is indicated by a solid line and to which the connection pins 62 of the connector plates 30d to 30f are connected is determined to be the position closer to the front surface L side of the printed wiring board 1A. As illustrated in the drawing, the description will be made on the assumption that the signal lines 4A and 4B embedded inside the printed wiring board 1A are connected to the different through holes 3 of the through hole 3 formed in the printed wiring board 1A, respectively.

Next, in selecting, an insertion direction of the connector pins 60 of the connector plates 30a to 30f into the printed wiring board 1A is selected according to the positions of the signal lines 4 embedded inside the printed wiring board 1A in signal line determining. Specifically, in selecting, when the position of the signal line 4A of the printed wiring board 1A is determined to be closer to the rear surface M side, the front surface L side is determined as the insertion direction of the connection pins 62 of the connector plates 30a to 30f into the printed wiring board 1A.

Further, for example, when the position of the signal line 4B embedded inside the printed wiring board 1A is determined to be the position closer to the front surface L side in selecting, the rear surface M side is selected as the insertion direction of the connection pins 62 of the connector plates 30a to 30f.

Figure 6B:
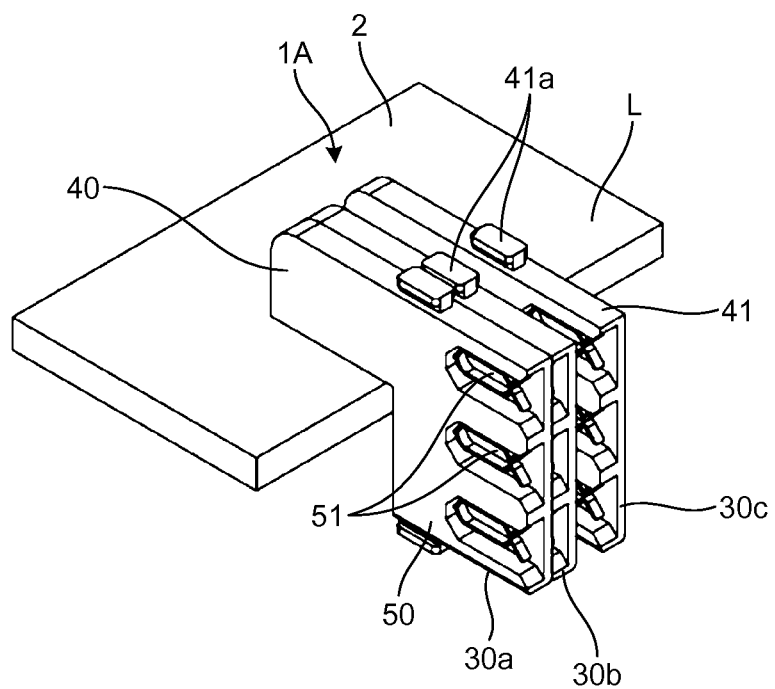
FIG. 6B is a diagram illustrating a process of manufacturing the printed wiring board.

Next, in connecting, the connection pins 62 of the connector pins 60 are connected to the through holes 3 based on the insertion direction of the connector pins 60 of the connector plates 30a to 30f into the printed wiring board 1A in selecting. That is, as illustrated in FIG. 6B, the position of the signal line 4A embedded inside the printed wiring board 1A is a position close to the rear surface M side of the printed wiring board 1A. Therefore, the connector plates 30a to 30c are press-fitted and fixed to the front surface L side of the printed wiring board 1A. As illustrated in the drawing, by fixing the connector plates 30a to 30c to the printed wiring board 1A in a direction in which the transmission path on the stub side is shortened, it is possible to prevent the adverse influence of the attenuation or the like of a signal due to the stub.

Figure 6C:
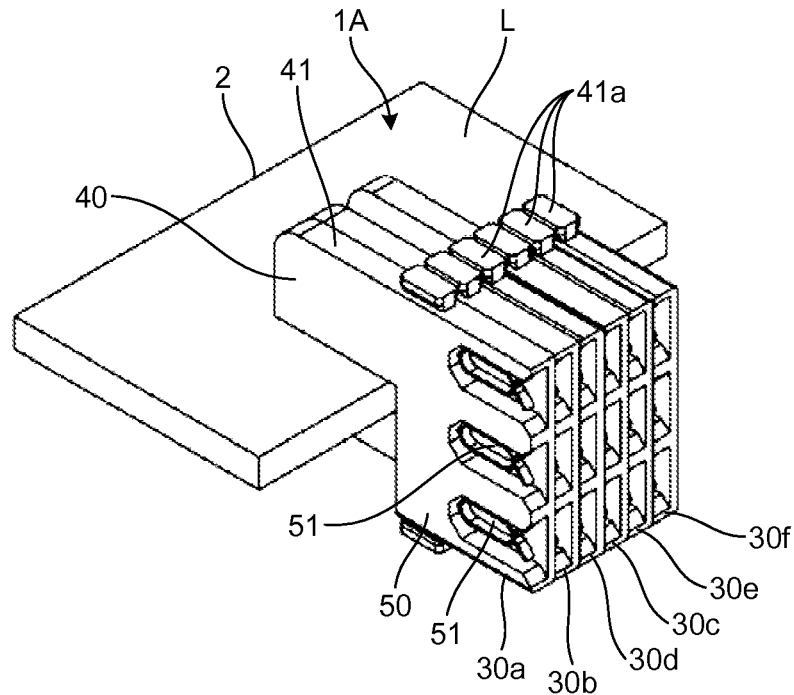
FIG. 6C is a diagram illustrating a process of manufacturing the printed wiring board.

Likewise, as illustrated in FIG. 6C, the position of the signal line 4B embedded inside the printed wiring board 1A is a position close to the front surface L side of the printed wiring board 1A. Therefore, the connector plates 30d to 30f are press-fitted and fixed to the rear surface M side of the printed wiring board 1A. As illustrated in the drawing, by fixing the connector plates 30d to 30f to the printed wiring board 1A in a direction in which the transmission path on the stub side is shortened, it is possible to prevent the adverse influence of the attenuation or the like of a signal due to the stub.

Figure 6D:
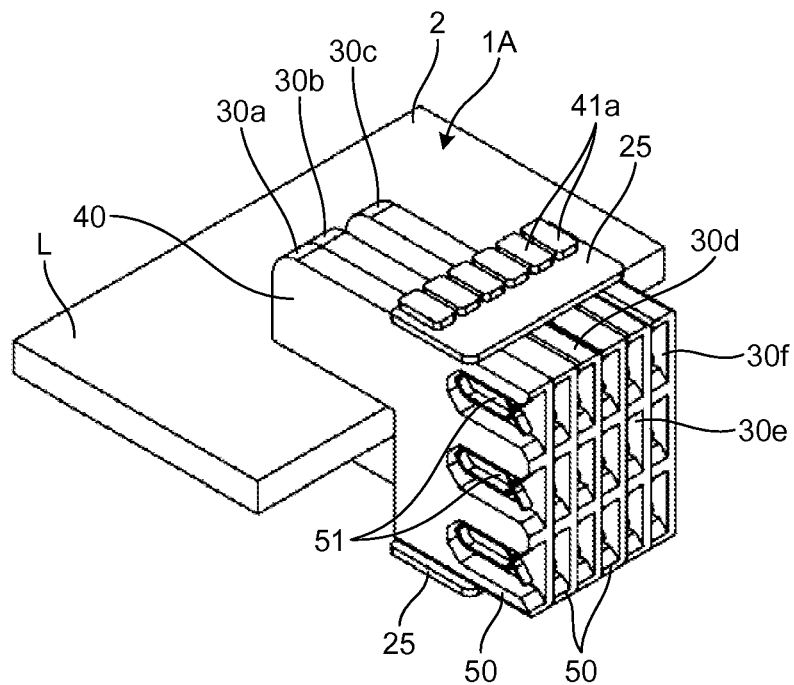
FIG. 6D is a diagram illustrating a process of manufacturing the printed wiring board.

Next, as illustrated in FIG. 6D, in fixing, the plurality of connector plates 30a to 30c connected to the front surface L side of the printed wiring board 1A in connecting is fixed by the fixing plate 25. Further, the plurality of connector plates 30d to 30f connected to the rear surface M side of the printed wiring board 1A are fixed by the fixing plate 25. In this way, the connector plates 30a to 30c connected to the front surface L side of the printed wiring board 1A and the connector plates 30d to 30f connected to the rear surface M side are fixed by one pair of the upper and lower fixing plates 25. Thus, the connector plates 30a to 30c and the connector plates 30d to 30f forming the connector 10A are strongly fixed so as to be arranged in the horizontal direction.

As described above, the printed wiring board 1A according to the first embodiment is formed by assembling the connector plates 30a to 30f including the connector pins 60 electrically connected to the signal lines 4 embedded at the predetermined positions of the printed wiring board 1A. Further, the connector plates 30a to 30f are inserted into the printed wiring board 1A in the direction selected from the front surface L side and the rear surface M side of the printed wiring board 1A so that the transmission path on the stub side is shorter than the transmission path of the signal lines 4. Thus, the high-speed transmission can be realized while ensuring the transmission quality by the connector 10A of the printed wiring board 1A. Further, the printed wiring board 1A can be manufactured at lower cost compared to the back drill process of shortening the transmission path on the stub side.

[b] Second Embodiment

Next, a connector of a printed wiring board according to a second embodiment will be described in detail with reference to FIGS. 7 to 9. Here, in the second embodiment to be described below, the same reference numerals are given to the same constituent elements as those of the connector described above in the first embodiment, and the detailed description will not be made.

Figure 7:
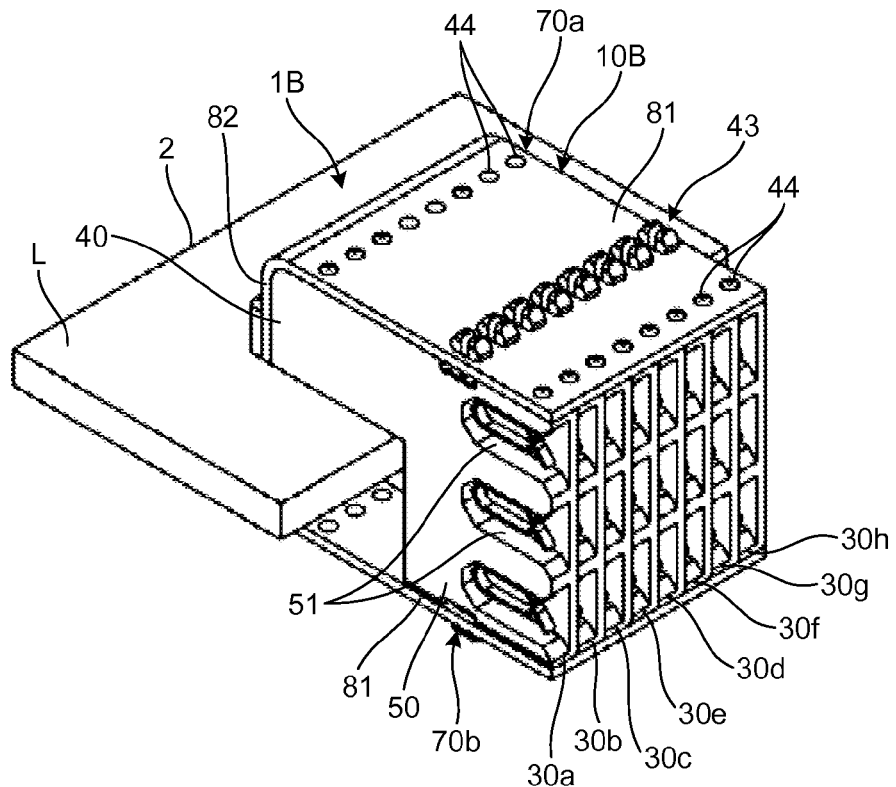
FIG. 7 is a perspective view illustrating the outer appearance of a printed wiring board according to a second embodiment.

FIG. 7 is a perspective view illustrating the outer appearance of the printed wiring board according to the second embodiment. FIG. 8 is a perspective view illustrating a connector plate. FIG. 9 is a perspective view illustrating the connector plates (upper side) and a fixing plate. FIG. 10 is a perspective view illustrating the connector plates (lower side) and the fixing plate.

In the second embodiment, as illustrated in FIG. 7, a connector 10B is connected to be press-fitted and fixed to a predetermined position (an end in FIG. 7) of a printed wiring board 1B. The connector 10B includes a pair of fixing plates 70a and 70b that integrally fix a plurality of connector plates 30a to 30h (eight connector plates in FIG. 7) in the upper and lower portions.

Here, the connector plates 30a to 30f forming the connector 10A described above in the first embodiment are configured to be fixed by the fixing plates 25, and then be press-fitted and fixed to the predetermined position of the printed wiring board 1A. The connector 10B of the second embodiment is different from the connector of the first embodiment. That is, the connector plates 30a to 30d among the plurality of connector plates 30a to 30h are press-fitted and fixed to one side (front surface L side) of the printed wiring board 1B, when positioned and fixed by the fixing plate 70a in advance. Likewise, the connector plates 30e to 30h are press-fitted and fixed to the other side (rear surface M side) of the printed wiring board 1B, when positioned and fixed by the fixing plate 70b in advance.

In FIG. 7, an embedded position of a signal line 4A (see FIG. 6A) to which the connection pins 62 of the connector pins 60 of the connector plates 30a to 30d are connected is a position close to the rear surface M side of the printed wiring board 1B. Therefore, as illustrated in the drawing, the connector plates 30a to 30d are press-fitted and fixed to the front surface L side of the printed wiring board 1B.

Further, an embedded position of a signal line 4B (see FIG. 6A) to which the connection pins 62 of the connector plates 30e to 30h are connected is a position close to the front surface L side of the printed wiring board 1B. Therefore, as illustrated in the drawing, the connector plates 30e to 30h are press-fitted and fixed to the rear surface M side of the printed wiring board 1B. In the second embodiment, the connector plates 30a to 30d and the connector plates 30e to 30h are fixed to the front surface L and the rear side M of the printed wiring board 1B in advance, after positioned and fixed by the fixing plates 70a and 70b. In the second embodiment, the insertion directions of the connector plates 30a to 30d and the connector plates 30e to 30h are selected according to the positions of the signal lines 4A and 4B embedded in the printed wiring board 1B so that the transmission path on the stub side is short, as in the first embodiment.

Hereinafter, the connector 10B will be described in detail. As illustrated in FIGS. 7 and 8, the connector 10B is formed by joining and combining the plurality of blade-shaped connector plates 30a to 30h (eight connector plates in FIG. 7). The connector plates 30a to 30h are formed of resin plates that each have an entire thin plate shape and a substantial L shape and each include an upper-side plate 40 and a lateral-side plate 50 curved at an almost right angle with respect to the upper-side plate 40.

Figure 8:
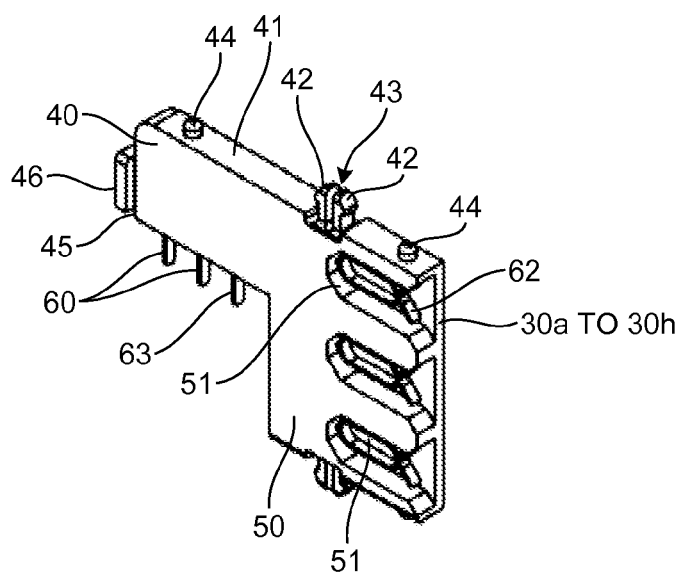
FIG. 8 is a perspective view illustrating a connector plate.

As illustrated in FIG. 8, an engagement convex portion 43 including a pair of engagement claw portions 42 is formed at the almost middle position of an upper surface 41 of the upper-side plate 40. A pair of circular convex portions 44 protruding upward are formed at both ends of the upper surface 41.

The engagement convex portion 43 formed and fixed to the upper-side plate 40 functions as a fixing portion that fixes the fixing plates 70a and 70b. The circular convex portions 44 formed on the upper-side plate 40 function as positioning portions that position the connector plates 30a to 30h. An engagement convex portion 46 protruding in one side (left side in FIG. 8) is formed on a side surface 45 of the upper-side plate 40.

The fixing plates 70a and 70b are each formed of a resin plate that has an entire thin plate shape and a substantial L shape and each include an upper-side plate 81 and a lateral-side plate 82. Two circular holes 84 and 85 fitted to one pair of circular convex portions 44 formed on the upper-side plate 40 of each of the connector plates 30a to 30f are formed at predetermined positions (both ends in FIGS. 9 and 10) of the upper-side plate 81. Further, engagement concave portions 86 engaging with the engagement convex portion 43 that includes one pair of engagement claw portions 42 of the upper-side plate 40 of each of the connector plates 30a to 30h are formed in the substantial middle of the upper-side plate 81. A plurality of engagement holes 83 formed in a pectinated shape are formed in the lateral-side plate 82 of each of the fixing plates 70a and 70b.

Here, the size (traverse width dimension) of each of the fixing plates 70a and 70b has a dimension corresponding to the number of the plurality of connector plates forming the connector. Therefore, by manufacturing the fixing plates having the dimension corresponding to the number of connector plates, the connectors including the fixing plates and having the same shape can be mass-produced, and thus the cost can be reduced.

Figure 9:
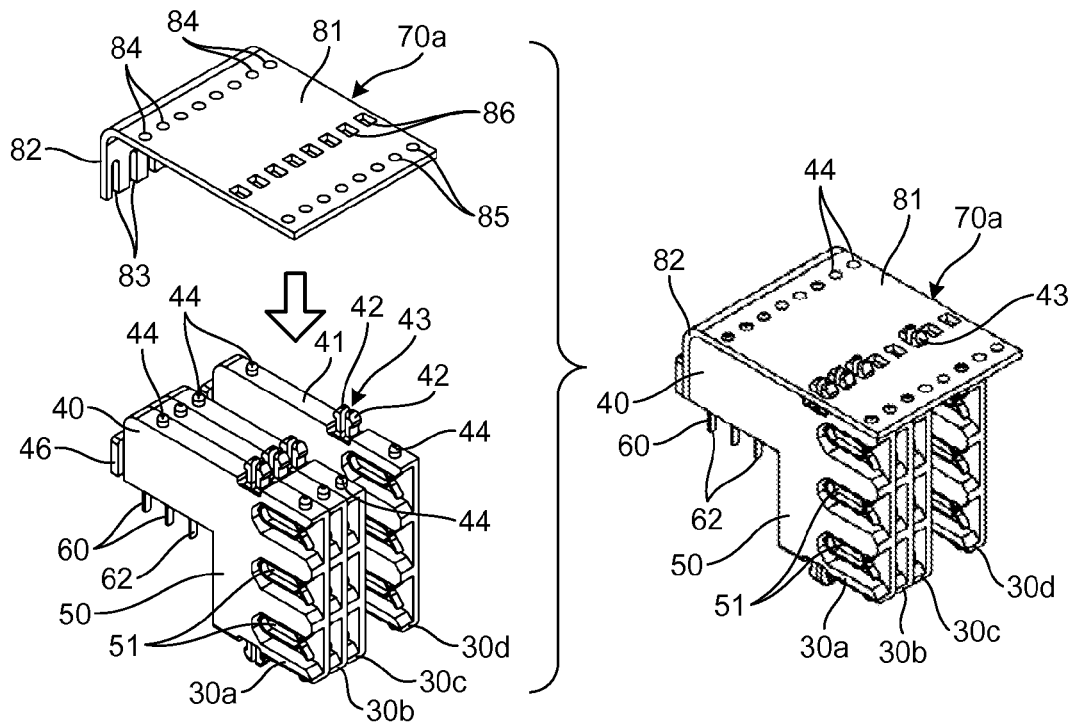
FIG. 9 is a perspective view illustrating the connector plates (upper side) and a fixing plate.
Figure 10:
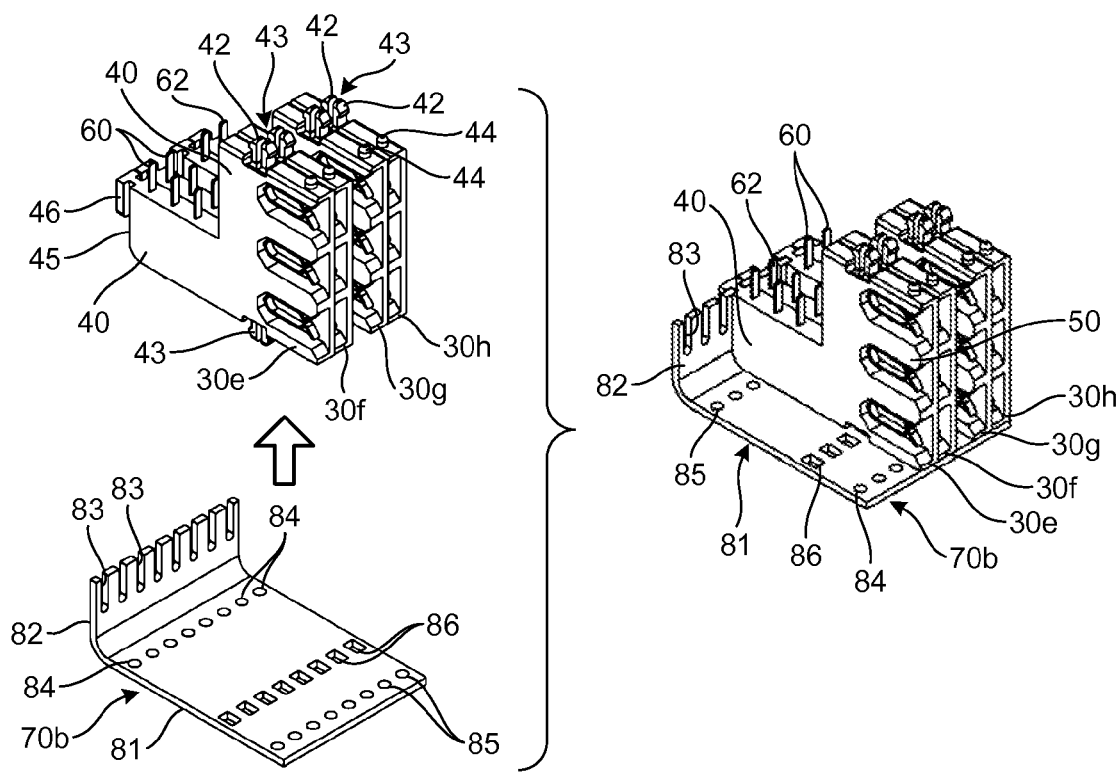
FIG. 10 is a perspective view illustrating the connector plates (lower side) and a fixing plate.
Figure 11:
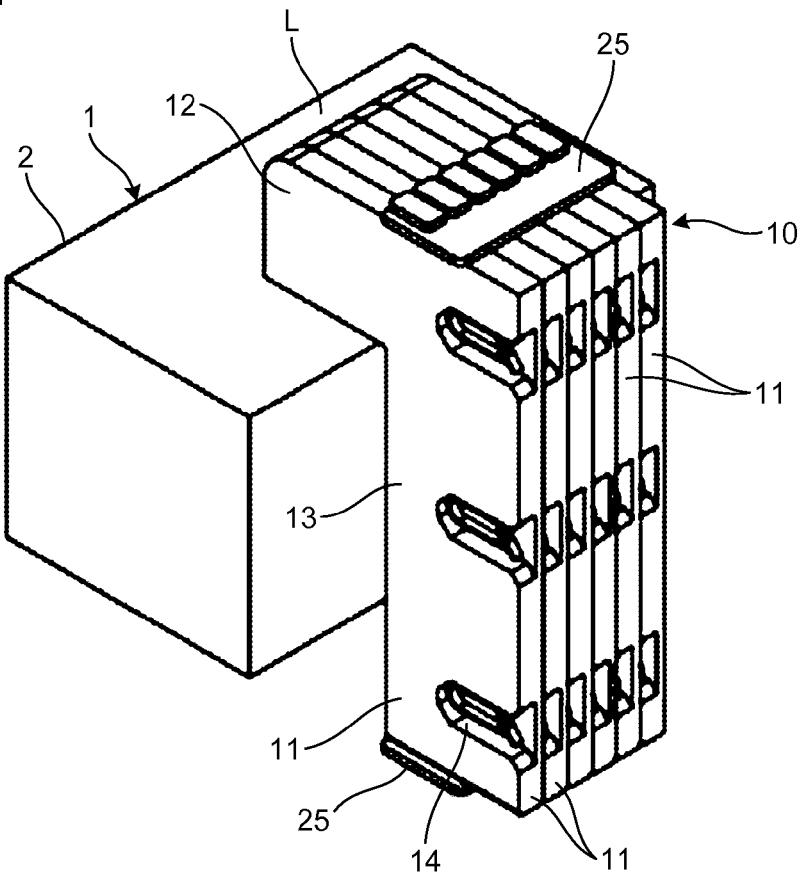
FIG. 11 is a perspective view illustrating the outer appearance of the printed wiring board.
Figure 12:
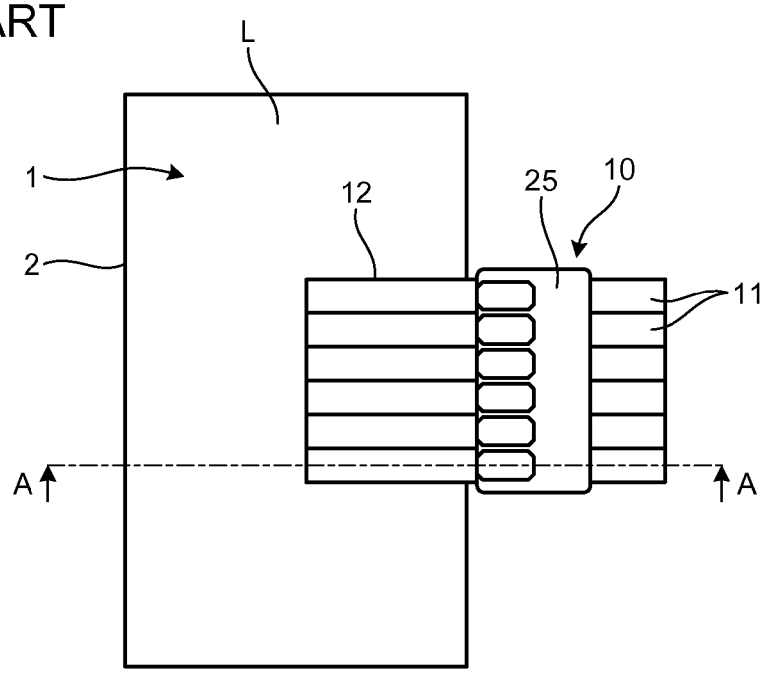
FIG. 12 is a plan view illustrating a connector in FIG. 11.
Figure 13:
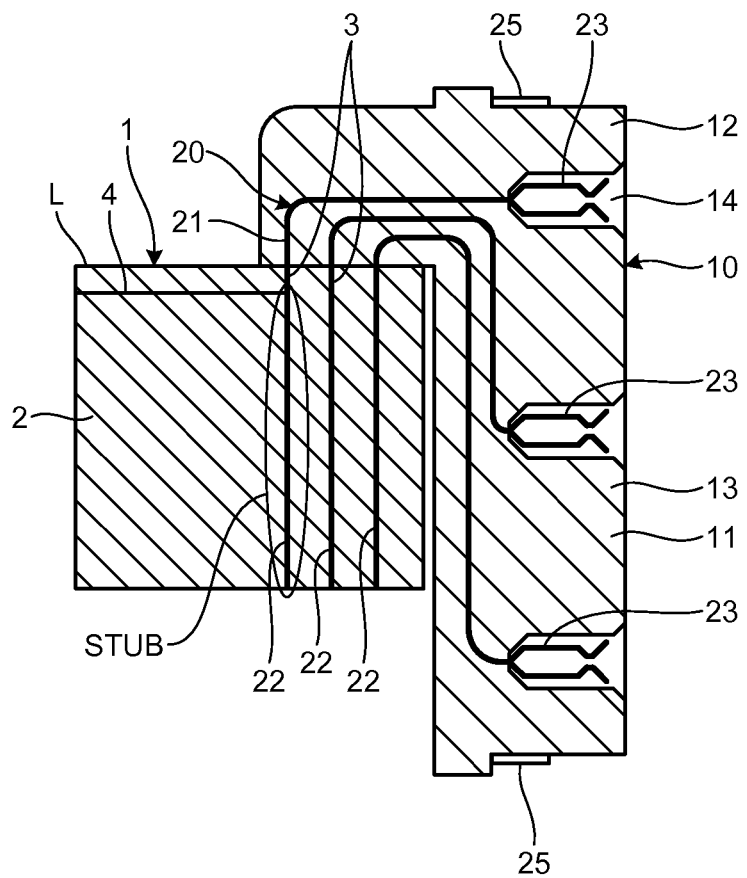
FIG. 13 is a sectional view illustrating the connector taken along the line A-A of FIG. 12.

As illustrated in FIG. 9, when the plurality of connector plates 30a to 30d (four connector plates in FIG. 9) are fixed by the fixing plate 70a, the engagement convex portions 43 formed on the upper-side plates 40 of the connector plates 30a to 30d engage with the engagement concave portions 86 formed in the upper-side plates 81 of the fixing plate 70a.

Likewise, one pair of circular convex portions 44 formed in the upper surface 41 of the upper-side plate 40 respectively engages with one pair of circular holes 84 and 85 formed in the upper-side plate 81 of the fixing plate 70a. Further, the plurality of engagement holes 83 formed in the lateral-side plate 82 of the fixing plate 70a respectively engage with the plurality of engagement convex portions 46 formed on the side surface 45 of the upper-side plate 40 of the connector plates 30a to 30d.

Thus, the connector plates 30a to 30d can be positioned and fixed to the fixing plate 70a. In this way, the connector plates 30a to 30d fixed integrally by the fixing plate 70a are press-fitted and fixed to the predetermined position (the end in FIG. 9) of the board body 2 from the front surface L side of the printed wiring board 1B.

Further, as illustrated in FIG. 10, when the plurality of connector plates 30e to 30h (four connector plates in FIG. 10) are fixed by the fixing plate 70b, the engagement convex portions 43 formed on the upper-side plates 40 of the connector plates 30e to 30h engage with the engagement concave portions 86 formed in the upper-side plates 81 of the fixing plate 70b. Likewise, one pair of circular convex portions 44 formed in the upper surface 41 of the upper-side plate 40 respectively engages with one pair of circular holes 84 and 85 formed in the upper-side plate 81 of the fixing plate 70b.

Further, the plurality of engagement holes 83 formed in the lateral-side plate 82 of the fixing plate 70b respectively engage with the plurality of engagement convex portions 46 formed on the side surface 45 of the upper-side plate 40 of the connector plates 30e to 30h. Thus, the connector plates 30e to 30h can be positioned and fixed to the fixing plate 70b. In this way, the connector plates 30e to 30h fixed integrally by the fixing plate 70b are press-fitted and fixed to the predetermined position (the end in FIG. 10) of the board body 2 from the rear surface M side of the printed wiring board 1B.

As described above, the connector 10B according to the second embodiment includes one pair of fixing plates 70a and 70b that integrally fix the plurality of connector plates 30a to 30h in the upper and lower portion of the printed wiring board 1B. The fixing plates 70a and 70b position the connector plates 30a to 30h and there are the plurality of fixing portions by the fixing plates 70a and 70b. Thus, it is possible to easily perform the positioning by the fixing plates 70a and 70b disposed and fixed to the connector plates 30a to 30d and the connector plates 30e to 30h, and it is possible to strongly perform the combining and the fixing.

According to an aspect of the present disclosure, it is possible to provide a printed wiring board, a connector, and a method of manufacturing the printed wiring board capable of realizing high-speed transmission while ensuring transmission quality of an electric signal transmitted from a signal line of the printed wiring board.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A printed wiring board comprising:
   a board body that includes a first signal line embedded at a wiring position closer to a first surface of the board body than to a second surface opposite to the first surface, a second signal line embedded at another wiring position closer to the second surface than to the first surface and a plurality of through holes each electrically connected to the first signal line or the second signal line; and
   a connector that includes:
      a first connector plate including a connection terminal inserted into one of the through holes from the first surface and electrically connected to the second signal line via the one of the through holes; and
      a second connector plate including a connection terminal inserted into another of the through holes from the second surface and electrically connected to the first signal line via the other of the through holes.

2. A connector comprising:
a first connector plate that includes a connection terminal inserted into a through hole from a first surface of a board body forming a printed wiring board and electrically connected to a signal line embedded in the board body at a wiring position closer to a second surface opposite to the first surface than to the first surface; and
a second connector plate that includes a connection terminal inserted into another through hole from the second surface and electrically connected to another signal line embedded in the board body at a wiring position closer to the first surface than to the second surface.

3. The connector according to claim 2, further comprising a fixing plate that includes:
   a fixing unit that integrally joins the first and second connector plates and integrally fixes the first and second connector plates; and
   a positioning unit that positions joining locations of the first and second connector plates.

4. A method for manufacturing a printed wiring board that includes a board body including a first signal line embedded at a first wiring position closer to a first surface of the board body than to a second surface opposite to the first surface, a second signal line embedded at a second wiring position closer to the second surface than to the first surface and a plurality of through holes each electrically connected to the first signal line or the second signal line, and a plurality of connector plates each including a connection terminal electrically connected to the signal line via one of the through holes, the method comprising:
   determining whether a wiring position of a signal line embedded in the board body is the first wiring position or the second wiring position;
   selecting one of the first surface and the second surface of the board body as a surface from which a connection terminal of a connector plate is inserted into a through hole according to the wiring position of the signal line determined at the determining;
   inserting a connection terminal of a connector plate to a through hole from the first surface of the board body to connect the connection terminal to the second signal line; and
   inserting another connection terminal of another connector plate to another through hole from the second surface of the board body to connect the other connection terminal to the first signal line.

5. The method according to claim 4, further comprising joining the connector plate whose connection terminal is inserted into the through hole from the first surface and the other connector plate whose connection terminal is inserted into the other through hole from the second surface, and integrally fixing the connector plates.

* * * * *